US007923818B2

(12) United States Patent  
De Vreede

(10) Patent No.: US 7,923,818 B2
(45) Date of Patent: Apr. 12, 2011

(54) VARACTOR ELEMENT AND LOW DISTORTION VARACTOR CIRCUIT ARRANGEMENT

(75) Inventor: Leonardus Cornelis Nicolaas De Vreede, Pijnacker (NL)

(73) Assignee: Technische Universiteit Delft (NL)

( * ) Notice: Subject to any disclaimer, the term of this patent is extended or adjusted under 35 U.S.C. 154(b) by 397 days.

(21) Appl. No.: 12/094,918

(22) PCT Filed: Nov. 24, 2006

(86) PCT No.: PCT/NL2006/050298
§ 371 (c)(1),
(2), (4) Date: May 23, 2008

(87) PCT Pub. No.: WO2007/061308
PCT Pub. Date: May 31, 2007

(65) Prior Publication Data
US 2008/0290465 A1 Nov. 27, 2008

(30) Foreign Application Priority Data

Nov. 24, 2005 (EP) .................................... 05111219
Jun. 2, 2006 (EP) .................................... 06114911

(51) Int. Cl.
*H01L 29/93* (2006.01)
(52) U.S. Cl. ................. 257/597; 257/E29.344
(58) Field of Classification Search ............... 257/597, 257/E29.344, 585, 596, 480, E21.466; 332/105; 333/32, 174; 327/355, 237
See application file for complete search history.

(56) References Cited

U.S. PATENT DOCUMENTS

| 3,764,415 | A |  | 10/1973 | Raabe et al. |
| 4,565,980 | A | * | 1/1986 | Ashida ........................... 332/105 |
| 4,868,134 | A | * | 9/1989 | Kasahara ....................... 438/379 |
| 5,339,041 | A | * | 8/1994 | Nitardy ............................ 330/10 |
| 5,757,074 | A | * | 5/1998 | Matloubian et al. ........... 257/702 |
| 5,763,909 | A | * | 6/1998 | Mead et al. .................... 257/291 |
| 6,137,323 | A | * | 10/2000 | Nicole et al. ................... 327/113 |
| 2002/0070815 | A1 |  | 6/2002 | Traub |

FOREIGN PATENT DOCUMENTS

| DE | 281486 A5 | 8/1990 |
| EP | 0452035 A1 | 10/1991 |
| WO | 9718590 | 5/1997 |

OTHER PUBLICATIONS

Sze, "Semiconductor Devices. Physics and Technology", 2002, John Wiley & Sons, pp. 103-104.*
Buisman et al. "'Distortion-Free' Varactor Diode Topologies for RF Adaptivity" pp. 20-24.

(Continued)

*Primary Examiner* — Thomas L Dickey
*Assistant Examiner* — Nikolay Yushin
(74) *Attorney, Agent, or Firm* — The Webb Law Firm

(57) ABSTRACT

A varactor element having a junction region, in which the depletion capacitance of the varactor element varies when a reverse bias voltage is applied to the varactor element. The varactor element has an exponential depletion capacitance-voltage relation, e.g. obtained by providing a predetermined doping profile in the junction region. The varactor element can be used in a narrow tone spacing varactor stack arrangement, in which two varactor elements are connected in an anti-series configuration. A low impedance path for base band frequency components between a control node and each of two RF connection nodes is provided, while for fundamental and higher order harmonic frequencies, a high impedance path is provided.

19 Claims, 12 Drawing Sheets

OTHER PUBLICATIONS

Buisman et al. "'Distortion-Free' Varactor Diode Topologies for RF Adaptivity", Microwave Symposium Digest, Jun. 2005, pp. 157-160.

Buisman et al. "Low-Distortion, Low-Loss Varactor-Based Adaptive Matching Networks, Implemented in a Silicon-on-Glass Technology", in Proc. 2005 Radio Frequency IC Symp., Long Beach, CA, Jun. 2005, 4 pages.

Meyer et al. "Distortion in Variable-Capacitance Diodes", Journal of Solid-State Circuits, Feb. 1975, vol. SC-10, No. 1, pp. 47-54.

* cited by examiner

Varactor

VARACTOR ELEMENT AND LOW DISTORTION VARACTOR CIRCUIT ARRANGEMENT

BACKGROUND OF THE INVENTION

1. Field of the Invention

The present invention relates to a varactor element having a junction region, in which the depletion capacitance of the varactor element varies when a reverse bias voltage is applied to the varactor element. Such a varactor element is also known as varactor diode, tunable diode, or voltage controlled capacitor.

1. Prior Art

Such varactor elements are known, and the behavior is well understood. In textbooks, it can be found that for diode based varactor elements, the capacitance voltage characteristic is in the form of $$C(V) = \frac{K}{(\phi + V)^m},$$

in which C(V) is the capacitance as function of the total (reverse) voltage V across the diode, $\phi$ is the built-in potential of the diode, m is the power law exponent of the diode capacitance and K is the capacitance constant. For a diode with a uniform doping profile, m=0.5, and for a diode with a hyper-abrupt junction, m≈1.5. Such a characteristic however limits the application of varactors in certain high quality applications, such as low distortion varactor stacks, especially when used in devices designed for operation with narrow tone spacing signals, such as in many modern day communications systems (see e.g. K. Buisman, L. C. N. de Vreede, L. E. Larson, M. Spirito, A. Akhnoukh, T. L. M. Scholtes and L. K. Nanver, "'Distortion free' varactor diode topologies for RF adaptivity," in 2005 IEEE MTT-S Int. Microwave Symp. Dig., Long Beach, Calif., June. 2005).

In order to overcome these drawbacks, recently varactor diode-based circuit topologies and a high performance varactor diode process technology has been presented, which, for a given diode power-law capacitance coefficient (m≧0.5), can act as variable capacitors with extremely low distortion. However, the proposed solutions have linearity constrains for modulated signals or signals with narrow tone spacing when considering practical implementations. The invention presented here aims to overcome these limitations, in terms of linearity for narrowband signals, sensitivity to leakage currents of the varactors, high control voltage and capacitance tuning range.

SUMMARY OF THE INVENTION

According to the present invention, a varactor element according to the preamble defined above is provided, in which the varactor element has an exponential depletion capacitance-voltage relation, as defined in the appended claim 1. Such a capacitance voltage relation, in the form of $C_{BBshort}(V)=a_1 e^{a_2 V}$, in which C(V) is the depletion capacitance as function of the total (reverse) voltage V across the varactor element, and $a_1$ and $a_2$ are predefined constants, allows to design many applications in which linearity for narrowband signals, sensitivity to the varactor leakage current, high control voltage and capacitance tuning range are important design constraints.

The exponential depletion capacitance-voltage relation is obtained by providing a predetermined doping profile in the junction region. By selecting a predetermined doping profile different from the known uniform or hyper-abrupt doping profile, the exponential capacitance-voltage relation of the varactor element may be obtained.

The junction region comprises, in a further embodiment, a filling layer in an interval of distances lower than $x_{low}$ with a doping concentration $N_{fill}$ lower than the doping concentration at distance $x_{low}$ ($N(x_{low})$). This allows to maintain the $N/x^2$ doping versus depth relation with respect to the junction position. The low doping concentration in the filling layer results in a lower contribution to the electric field in order not to lower the intended breakdown voltage of the diode or unnecessary increase the required control voltages.

The junction region comprises a single sided junction, e.g. a Schottky diode or a PN junction diode with the one side of the junction doped significantly higher then the intended region for depletion, and the varactor element is e.g. provided with a doping profile substantially defined by $N(x)=N/x^2$, N(x) being the varactor element's doping concentration in one dimension as a function of x, x being a distance from the (effective) junction, and N being a predefined doping concentration constant. Especially in electronic circuit design for modulation of RF signals, in which third order inter modulation should be suppressed, such varactor elements can be advantageously applied, even when narrow tone spacing signals are involved.

In a further embodiment, the doping profile is substantially equal to N(x) at least in the interval $x_{low} \ldots x_{high}$ in which $x_{low}$ is nearer to the junction than $x_{high}$. This allows to obtain a profile having a doping concentration of feasible values (the above formula would become singular for x=0). The ratio of $x_{high}$ and $x_{low}$ defines the useful capacitance tuning range.

The junction region of the varactor element may also be a two sided or double sided junction. To obtain the exponential relation in this case is more complicated, but certainly attainable in many different manners, e.g. using a more complex doping profile. An example of a double sided junction could be for example the use of a low P-type doping for the filling layer, which in normal varactor operation is completely depleted. Note that in such a implementation although the doping junction is moved, the resulting C(V) relation can still show the desired exponential dependency on the voltage.

In known circuit arrangements, low distortion varactor operation for larger tone spacing is accomplished by utilizing two back to back varactor diodes utilizing a uniform doping, or for hyper abrupt varactors (grading coefficient m>0.5) utilizing a parallel configuration of two anti-series varactor diodes. The known varactors configurations behave only linear if the impedance connected to the center tap is significantly higher than the impedance offered by the varactor diode capacitances itself, this condition should be satisfied for all frequency components involved. In practice this proves to be very problematic for two tone signals with narrow tone spacing or modulated signals. The above can be easily understood by considering a two-tone test signal with a tone spacing approaching zero. As consequence the impedance offered at the difference frequency ($f_2-f_1$) by the varactor diodes will approach infinity when $f_1$ approaches $f_2$. It is obvious that this yields an unrealistic condition for the center tap impedance which has to be larger then the impedance offered by the diodes. Typically very high center tap impedances are required in the conventional solution. This give rise to various problems, since the center tap is more or less "floating". When using a high valued resistor for the center-tap impedance also any leakage current of the varactor diodes becomes problematic due to resulting DC offsets of the center tap in respect to the control voltage. Some improvement can be obtained for this situation by using an anti parallel diode configuration in the center tap path in order to increase the AC center-tap impedance. Although good results have been achieved in simulation with this configuration for moderate tone spacing, the use of narrow tone spacing remains problematic and also this configuration is still relative sensitive to leaking currents of the varactor diodes.

The solutions above might provide reasonable performance of the resulting tunable capacitor where static loading conditions are required, but are less suited when fast modulation of the tunable capacitor is needed. Note that these conditions typically apply in modulators, dynamically varied phase shifters, or adaptive matching networks for dynamic load line modulation mixers, etc. Other short comings are the limited capacitance tuning range and high control voltage when using a uniform doping profile. When using the hyper abrupt varactors the linearity is somewhat degraded compared to uniformly doped varactor implementation.

In a further aspect of the present invention, it is therefore proposed to provide a varactor stack circuit arrangement, comprising two varactor elements according to an embodiment of the present invention, each having two terminals, in which the two varactor elements are connected in an anti-series configuration, such that a control node is provided by two interconnected terminals and two RF connection nodes by the other terminals. Such an arrangement, also called narrow tone spacing varactor stack (NTSVS), provides an improved performance compared to existing arrangements. The two varactor elements may be connected to each other using a common cathode, or using a common anode. This allows the possibility to choose what kind of control voltage (positive or negative relative to the RF terminals) can be used in the varactor circuit arrangement. The varactor elements used in this arrangement may be identical.

In a further embodiment, the varactor circuit arrangement further comprises a center tap impedance connected to the control node, the center tap impedance providing a low impedance path for base band frequency components between the control node and each of the two RF connection nodes. A high impedance path for fundamental and higher order harmonic frequency components may also be provided. The indications low and high impedance refer to the impedance offered by the varactor circuit arrangement itself for the frequency component under consideration. This results in a varactor circuit arrangement having a high linearity for modulated signals and narrow tone spacings, and a high tuning range compared to uniform doped varactors. Only low control voltages are needed, and the arrangement is not sensitive for leakage current of the varactor diodes. Furthermore, no high impedance condition is required at the base band frequencies making it more suitable for the implementation of modulators, mixers and dynamic/adaptive matching networks.

The low impedance path has an impedance lower than the one offered by the varactor element capacitances for the baseband frequency component, which allows for a very efficient suppression of third order inter modulation distortion in the varactor circuit arrangement.

The NTSVS may be applied in numerous applications, as part of more complex circuitry. In an even further aspect, the present invention relates to a four port electronic device, comprising two series capacitors and two cross connected capacitors, in which one of the two series capacitors is connected between a first input port and a first output port, the other of the two series capacitors is connected between a second input port and a second output port, one of the two cross connected capacitors is connected between the first input port and the second output port, and the other of the two cross connected capacitors is connected between the second input port and the first output port. At least the two series capacitors or the two cross connected capacitors comprise a varactor stack arrangement according to an embodiment of the present invention. The other capacitors may then be fixed capacitors. In a very advantageous embodiment, all four capacitors are voltage controlled variable capacitors implemented using the varactor stack arrangement according to the present invention. Such a four port electronic device, or differential varactor amplitude modulator (DVAM), may be applied directly as amplitude modulator, but may also be applied in more complex circuitry, such as a transmitter, polar amplifier circuit, and a direct modulator.

In a further embodiment, the four port electronic arrangement further comprises a first shunt inductor connected between the first and second input port, and a second shunt inductor connected between the first and second output port. This allows this circuitry to be used as an amplitude modulator or as an adaptive matching network. Compared to conventional designs, far less components are needed. Also, in combination with an RF amplifier stage, this arrangement may be advantageously used in a transmitter, allowing a very high power added efficiency (PAE) for modulated signals or (slowly) varying output power conditions. Also, polar amplifiers may be designed in which the amplifier efficiency is boosted by saturated operation of the active components in the polar amplifier. At the output of the amplifier, square wave like signal conditions result. Using the four port electronic arrangement of the present invention in this case, allows to obtain a highly efficient polar amplifier.

In an even further aspect, the present invention relates to a direct polar modulator, comprising a four port electronic arrangement according to the present invention, in which the first and second output ports are further connected to a series of phase shift sections, each phase shift section comprising a varactor stack arrangement according to an embodiment of the present invention. Each of the varactor stack arrangements (in the amplitude modulator and in the phase shift sections) can be controlled using control voltages. E.g. a digital to analogue converter may be used to set all control voltages of the varactor stack arrangements. Such a modulator structure can be part of a transmitter which is directly capable to serve many different modulation formats, such as QPSK, BSK, FSK, OFDM, etc. Also, multiple frequency bands can be accommodated by offsetting the varactor stack arrangement values in a proper way.

The present invention also relates to the use of a varactor stack arrangement according to an embodiment of the present invention, in adaptive or dynamic matching networks, in adaptive or tunable phase shifter devices, in direct modulators arrangements, as up converting mixer or modulator, in RF switches, in tunable filters or multiplexers, etc. A further example includes the use of a varactor stack arrangement in antenna array systems, such as phased arrays to perform adaptive beam forming.

SHORT DESCRIPTION OF DRAWINGS

The present invention will be discussed in more detail below, using a number of exemplary embodiments, with reference to the attached drawings, in which FIG. 1 shows a doping profile diagram of an embodiment of the varactor element according to the present invention having a single sided junction;

FIG. 18b shows a op view of the varactor stack arrangement of FIG. 18a.

DETAILED DESCRIPTION OF EXEMPLARY EMBODIMENTS

According to the present invention, a varactor element is provided having an exponential capacitance voltage relation, according to $$C_{BBshort}(V) = a_1 e^{a_2 V} \quad \text{equation 1}$$

in which C(V) is the capacitance as function of the total (reverse) voltage V across the varactor element, and $a_1$ and $a_2$ are constants which value can be chosen based on the application considerations (tuning range, quality factor of the NTSVS, voltage range).

The capacitance voltage relation of commonly used diode varactors is known to the skilled person as being equal to $$C(V) = \frac{K}{(\phi + V)^m} \quad \text{equation 2}$$

in which C(V) is the capacitance as function of the total (reverse) voltage V across the diode, φ is the built-in potential of the diode, m is the power law exponent of the diode capacitance (m=0.5 for a diode with a uniform doping profile) and K is the capacitance constant.

It has been found that the desired relationship (equation 1) can be achieved by modifying the doping profile of the varactor element, especially the doping profile of the junction region of the varactor element.

For this purpose a one-side junction (e.g. a Schottky diode) is assumed and solve for the doping profile using the known relation $$N(x) = \frac{C(V)^3}{q\varepsilon} \left(\frac{dC(V)}{dV}\right)^{-1}$$

with $$x = \frac{\varepsilon}{C(V)}$$

Making use of the above relations, it can be proven that the required doping profile for an exponential capacitance voltage relation in this case is:

$$N(x) = \frac{N}{x^2} \quad \text{equation 3}$$

in which N is a doping concentration constant to be defined. It should be noted that the upper formulation of the doping profile is singular for x=0, consequently, measures to avoid this singularity must be taken. In order to explain how the doping profile for a first embodiment of a varactor element according to the present invention should be defined we consider FIG. 1, which shows the required varactor doping profile for a single sided junction of the varactor element to achieve the exponential C(V) relation.

Figure 1:
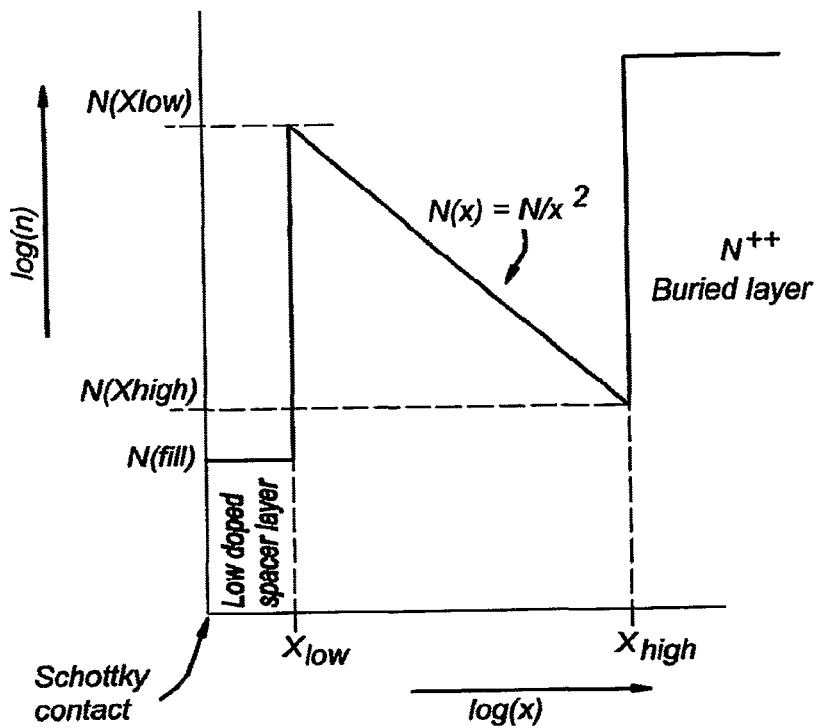

As become clear from FIG. 1 the $N/x^2$ doping relation appears as a straight line on logarithmic plot of the doping concentration versus the logarithm of the distance (x). Since an infinitely high or extremely low doping concentration cannot be provided, this relation has to be broken off at the distances $x_{low}$ and $x_{high}$. Doing so, automatically the useful capacitance tuning range ($C_{ratio}$) is defined since the capacitance is inversely proportional with the distance x.

$$C_{ratio} = x_{high}/x_{low}$$

To achieve the exponential C(V) relation for a single sided junction a filling or "spacer" layer is required in order to satisfy the $N/x^2$ doping versus depth relation with respect to the junction position (e.g. a doubling of the distance with the junction should result in a four times lower doping concentration). This spacer or filling layer, which in the useful varactor diode operation is depleted, preferably does not increase the electric field significantly to avoid reduced device breakdown and capacitance tuning range. To achieve this, the doping concentration of this filling layer must be kept low in respect to $N(x_{low})$. $N(x_{low})$ must be chosen in such a way that in combination with the desired tuning range and control voltage, the zero bias varactor quality factor is maximized without exceeding the critical electric field at the varactor junction for the maximum operation voltage intended. Since the slope of the doping concentration is fixed by the required exponential capacitance voltage relation, the doping profile is basically defined with the choice of: $x_{low}$, $x_{high}$ and $N(x_{low})$.

As one would expect there is a trade-off in capacitance tuning range, control voltage en Q-factor of the varactor element. For this reason the use of III-V materials or wide band gap materials is recommended for this structure. E.g. when using GaAs the intrinsically higher electron mobility (~a factor 5) of this material compared to silicon, yields a 5×Q improvement for an identical structure. However, for low control voltages good results can be also obtained using silicon.

Figure 2A:
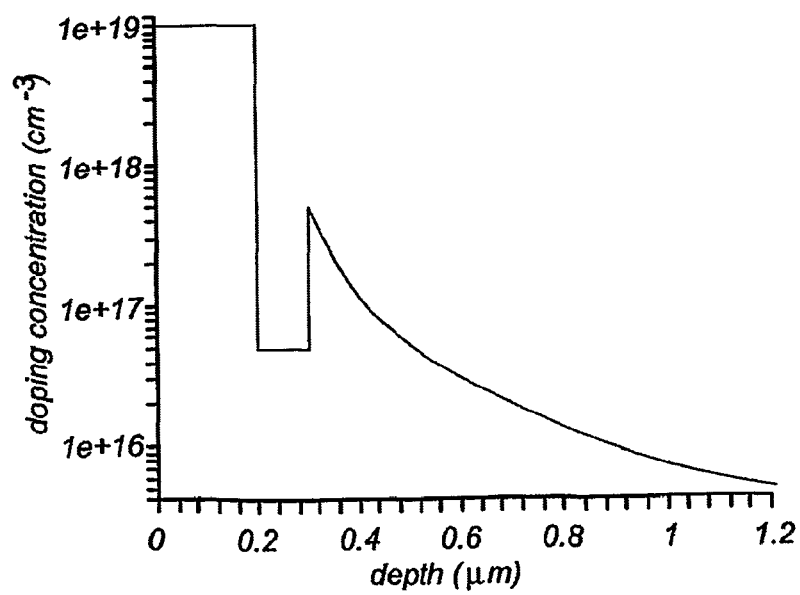
FIG. 2a shows a doping concentration versus depth profile of a further embodiment of the varactor element according to the present invention (in this doping profile the effective junction is located at 0.2 μm)
Figure 2B:
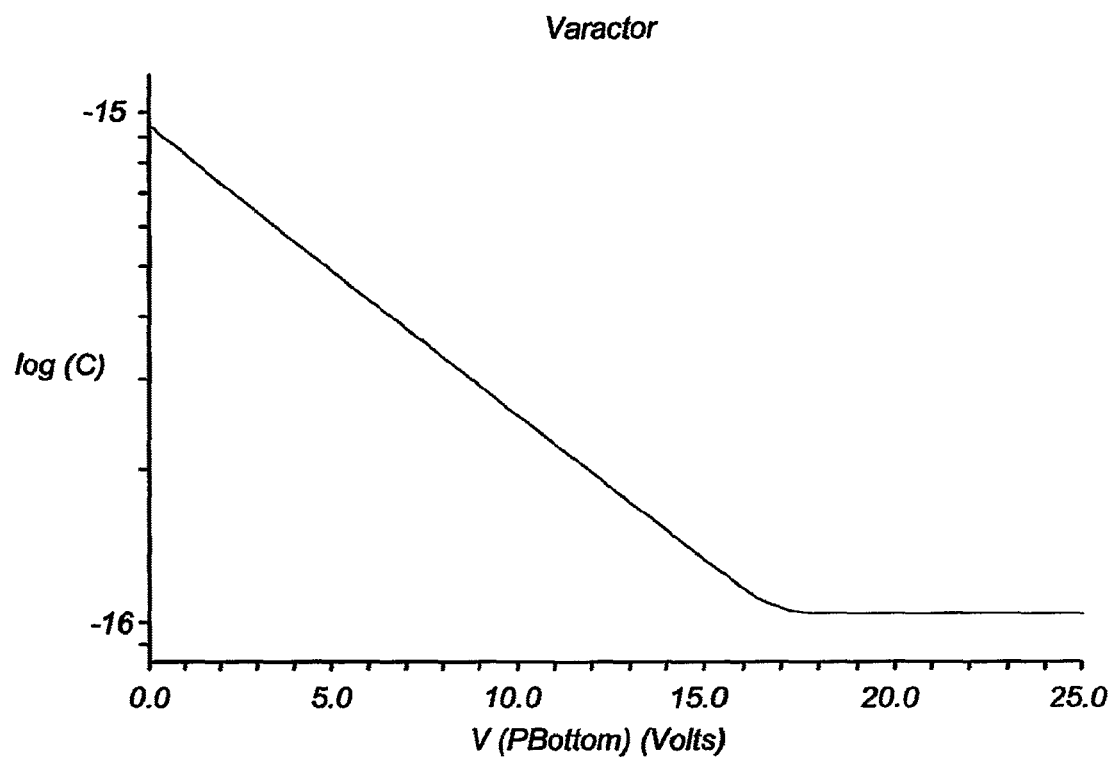
FIG. 2b shows the associated capacitance-voltage characteristic.

Simulations have been performed for a varactor element having a doping profile as shown in FIG. 2a. In this doping profile, the complete doping profile is shown, including the highly doped region (1e+19) left of the filling layer (5e+16). The lightly doped filling layer in the doping profile avoids a rapid increase of the electric field near the junction. This relaxes the device voltage breakdown conditions. Note that for a one sided junction, this filling layer is provided in combination with the doping concentration of equation 3 to obtain the desired C(V) characteristic (equation 1), which when plotted on a log scale should results in a substantially straight line as shown in the plot of FIG. 2b. It must be mentioned that this behaviour is characteristic for the proposed doping profile. Any deviation of the straight line in FIG. 2b will result in an increase of the IM3 distortion level. The related zero bias Q of this particular example is limited to ~20 for a silicon device. By selecting an other choice for the parameters of FIG. 1, the voltage range or capacitance tuning ratio can be adjusted, consequently one can improve for the Q (values>300 are feasible in silicon), breakdown voltage (values>100V are feasible in silicon for a constrained capacitance tuning range and quality factor) or tuning range (values>15 are feasible in silicon for a constrained breakdown voltage and Q factor). Clearly there is a trade off between the Q factor, breakdown voltage and tuning range. One can improve for this trade of by using other technologies with a higher mobility like GaAs, which due to its roughly 5× higher mobility compared to silicon, will yield an approximately 5 times higher Q factor for a given varactor doping profile. When considering the device in FIG. 2 the zero bias Q factor would be approximately 100 when implemented in GaAs. Also the use of wideband gap materials can be beneficial since this allows the use of higher doping concentrations and electric field conditions at the device junction. The exact doping profile of the filling layer is normally not of great significance to the desired exponential C(V) relation. However, due to the fact that in real devices the abrupt depletion approximation is not very accurate, one can utilize the doping structure of this spacer layer to improve on the intended exponential C(V) relation for the low voltage range.

In the above example description, a one sided junction has been used. In a one sided junction the doping level on one side of the junction is much higher than on the other side. As a result the depletion region will only effectively extend in one-direction.

However, to obtain the exponential capacitance voltage dependence according equation 1, other solutions to realize this behaviour are possible if one utilizes two or double-sided junction solutions. In this case there are in principle an unlimited number of solutions possible for the doping profile which can yield the desired behaviour of equation 1.

Figure 3A:
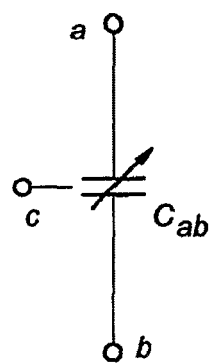
FIG. 3a shows a general symbol for a controlled variable capacitor, and FIGS. 3b and c show embodiments of such a capacitor using an anti-series arrangement of two variable capacitance varactor diodes.
Figure 3B:
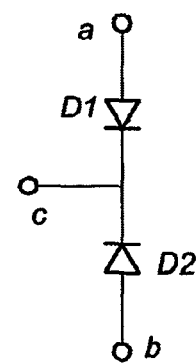
Figure 3C:
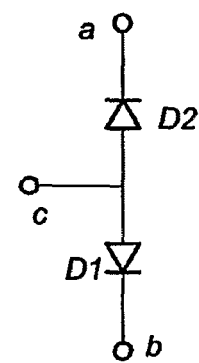

A varactor element according to any of the embodiments described above, may be advantageously applied as a variable voltage controlled capacitor. In FIG. 3a, a general schematic symbol is shown of such a variable voltage controlled capacitor as a three terminal device. Between nodes a and b (or RF connection nodes), a variable capacitance $C_{ab}$ is present, and node c is used as control voltage input. Actual implementations using varactor diodes are shown schematically in FIGS. 3b and 3c, which show two varactor diodes D1, D2 each having two terminals, connected in anti-series configuration between nodes a and b. Node c is formed by the connecting point of two of the terminals of the diodes (cathode of the diodes in FIG. 3b, anodes of the diodes in FIG. 3c). FIG. 3b shows a common cathode implementation, intended for a positive control voltage at node c relative to the nodes a and b and FIG. 3c shows a common anode implementation, intended for a negative control voltage at node c relative to the terminals a and b. Using varactor elements having the desired characteristic of equation 1 as described above, it is possible to build various applications which beneficially exploit this characteristic.

In a first exemplary embodiment, the varactor elements are used to provide a narrow tone spacing varactor stack device. Such an NTSVS device may be advantageously used in all sorts of amplitude and phase modulators, which in turn may be used in adaptive or dynamic matching networks, adaptive or tunable phase shifter devices (e.g. in phased array systems), direct modulators, up converting mixers or modulators, RF switches, tunable filters or multiplexers, etc.

The invention introduced here, the "Narrow Tone Spacing Varactor Stack" (NTSVS), is a low distortion tunable capacitor which provides excellent linearity for narrowband or modulated signals, making it very attractive for transmitter or modulator applications. The tunable capacitor is based on two back-to-back varactors with a very specific ($N/x^2$) based doping profile (assuming a single sided junction). The configuration utilizes base-band shorts at the center tap and external pins. Such an NTSVS features a high linearity for modulated signals and narrow tone spacings, a high tuning range compared to uniform doped varactors, low control voltages, is not sensitive for leakage current of the varactor diodes, and no high impedance conditions required at base-band or IF impedance making it more suitable for the implementation of modulators, mixers and dynamic/adaptive matching networks.

Figure 4:
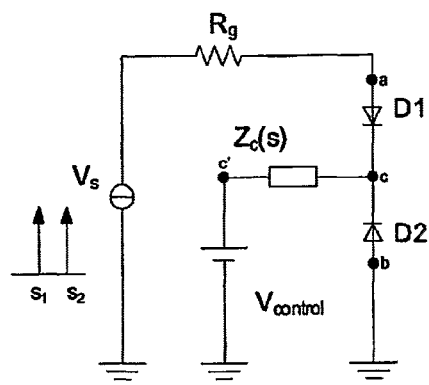
FIG. 4 shows a schematic circuit diagram of an embodiment of the anti-series arrangement using varactor diodes, as used for various simulations.

A schematic circuit diagram of a NTSVS is shown in FIG. 4. The NTSVS is used in a common cathode configuration, and the node b of bottom diode D2 is connected to ground. The node a of the upper diode D1 is connected to a signal source $V_s$ via a resistor $R_g$. The signal source $V_s$ is grounded at the other side, and provides a two tone signal (indicated by $s_1$ and $s_2$) with a narrowband spacing. A control voltage $V_{control}$ is applied to the control node c' of the varactor stack, by means of a center tap impedance $Z_c(s)$ of which the other terminal is connected at node c. The diodes D1 and D2 may be identical.

In known arrangements using a stack of varactor diodes, it is assumed that $Z_c$ can be considered as infinitely high impedance for all frequency components. When solving for this situation the third order inter modulation (IM3) component of the voltage on the connecting terminal of the varactor configuration the following expression is found:

$$IM3_{z_c=\infty} = \frac{3(2s_1-s_2)(2c_1^2-c_0c_2)g_s^2A^2}{4c(2g_s+s_1c)(2g_s-s_2c)((2s_1-s_2)c+2g_s)} \quad \text{equation 4}$$

in which:

$$c_0 = \frac{dq(v)}{dv}$$
$$c_1 = \frac{1}{2}\frac{d^2q(v)}{d^2v}$$
$$c_2 = \frac{1}{6}\frac{d^3q(v)}{d^3v}$$

are the Taylor coefficients of the varactor diode, $g_s$ is the source conductance ($1/R_g$) and $s_1$ and $s_2$ are the complex frequencies, while A is the amplitude of the voltage signal source. It can be observed from equation 4 that the IM3 distortion is cancelled when we satisfy the following condition for the varactor Taylor coefficients.

$$c_0c_2 - 2c_1^2 = 0$$

Solving this differential equation for the capacitance function, while assuming an equal area of the varactor diodes in FIG. 4 yields, the well known C(V) textbook relation (equation 2 above), with m=0.5.

$$C(V) = \frac{K}{(\phi+V)^m}$$

When solving the IM3 component of the arrangement of FIG. 4 (again assuming an equal area of the varactor diodes) but now using the condition $Z_{a(f2-f1)}=0$ (base band short), while $Z_c$ is infinitely high for all other frequency components, the following IM3 cancellation condition is found for very narrow tone spacing ($\Delta f \rightarrow 0$):

$$IM3_{BBshort} = \frac{(2c_1^2-3c_0c_2)g_s^2s_cA^2}{4c(2g_s-s_cc)(2g_s+s_cc)^2}$$

The resulting C(V) relation, which can be found by solving the differential equation, $$3c_0c_2 - 2c_1^2 = 0$$

proves now to be an exponential relation rather then the well known text book C(V) relation (equation 2), and is given by:

$$C_{BBsshort}(V) = a_1 e^{a_2 V}$$

In this relation $a_1$ and $a_2$ indicate the integration constants, which add some flexibility to our solution. Note that any choice of $a_1$ and $a_2$ will satisfy the differential equation, yielding perfect cancellation of the IM3 distortion component also for narrow tone spacing. The varactor element embodiments as described above fulfill this exponential relation and may advantageously be used in an NTSVS arrangement as shown in FIG. 4 to obtain the desired IM3 distortion cancellation.

For this IM3 cancellation, a low AC impedance path at the base-band frequencies (this is relative to the AC impedance offered by the varactor capacitance itself) between the center node c and the RF terminals a and b is needed. Simultaneously, for the high frequency components (fundamental, and higher harmonics) the AC impedance between the node c and node a, or node c and node b must be high (this again relative to the AC impedance offered by the varactors itself at these frequency components).

Using the configuration of FIG. 4 we have simulated the Voltage IP3 of the capacitance currents as function of tone spacing, for an existing solution using a distortion free varactor stack (DFVS) and for a solution using the now proposed NTSVS. In the DFVS, the ratio of cross sectional areas of the two diodes are adapted to minimize third order distortion. It has been found that while the conventional DFVS provides the highest linearity for large tone spacing for a given center tap impedance, the NTSVS provides the best results for small values of $\Delta f$. The cross sectional areas of the two diodes may be the same in the case of the NTSVS. It is important to note that there must be a low impedance (relative to the impedance offered by the varactor diodes) path for the base-band frequency component between the center tap and the external pins. The corner frequency where the linearity starts to degrade is related to how well one succeeds to provide low impedance for the base-band frequencies and simultaneously provide high impedance for the fundamental and higher harmonic frequency components. As a result a more sophisticated network can provide improvements.

All impedance levels indications are relative to the varactor diode impedance at the harmonic component under consideration. The NTSVS can be effectively used for static conditions e.g. to tune out antenna mismatch condition, adaptive matching, switching, phase shifting etc., but can also be used dynamically to implement modulator or mixing functions.

In order to create a useful linear mixing function using the arrangement of FIG. 4, two basic conditions should be fulfilled, namely:

1) The capacitive current flowing though the effective capacitance of the varactor stack $c_{ab}$ should be linearly related to the applied RF voltage over the nodes a and b. In most practical (telecommunication) applications this requires a zero value for the $3^{rd}$ order Volterra kernel of $c_{ab}$ with respect to the applied RF signal over the nodes a and b. Consequently, no third-order intermodulation distortion products arise in the resulting current through $c_{ab}$.

2) For the desired mixing action, the effective capacitance $c_{ab}$ must be modulated in such a way that the desired transfer function of the total circuit is modulated in a linear fashion. This has as consequence that one should compensate (pre-distort) for the non-linear C(V) relation of $c_{ab}$ with respect to the center tap voltage at node c, as well for how a capacitance change relates to transfer function of the total circuit.

Condition 1) is the most important one, since distortion at the RF signal level can not easily be encountered for. Condition 2) is less critical since the controlling voltage in a modulator is typically a base-band signal, which can be accurately controlled or pre-distorted in a rather arbitrary fashion.

In the following examples, a two-tone RF voltage source $V_s$ is connected to node a. The capacitance is modulated by an independent voltage source ($V_{control}$) connected to node c. Depending on the C(V) relation, this modulating voltage is pre-distorted using a set of equations and a non linear pre-distorting element. As a result a linear variation of $c_{ab}$ with the modulating base-band signal is obtained and consequently the desired capacitive mixing action. It must be mentioned that this mixing is perfectly linear under the constraint that $c_{ab}$ does not generate any inter modulation distortion due to the applied RF voltage at the nodes a and b.

Figure 5:
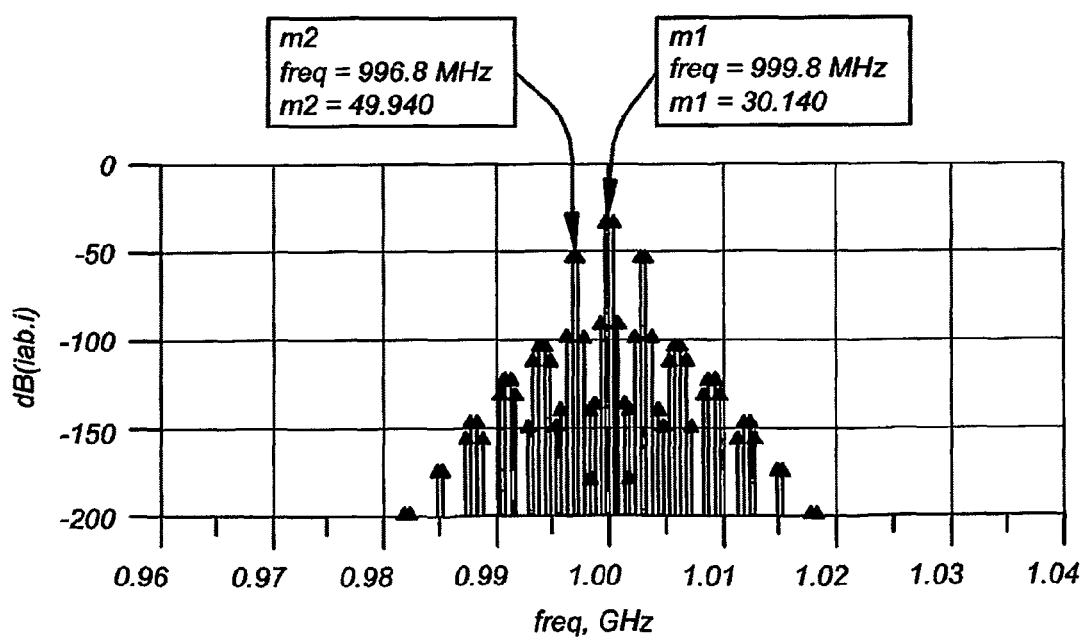
FIG. 5 shows the resulting spectrum of the capacitive current flowing through the varactor stack in the circuit of FIG. 4 using conventional varactor diodes, when the node c' is modulated by 3 MHz signal, while applying a 1 MHz two-tone signal on a carrier wave of 1 GHz to the RF terminal(s)

When using the Distortion Free Varactor Stack (DFVS) configuration in the schematic of FIG. 4 the resulting spectrum of the capacitive current as shown in FIG. 5 is obtained. The AM side bands around the center frequency are visible, but the result is rather bad in terms of the IM3 components, which appear around the two-tone signals.

Figure 6:
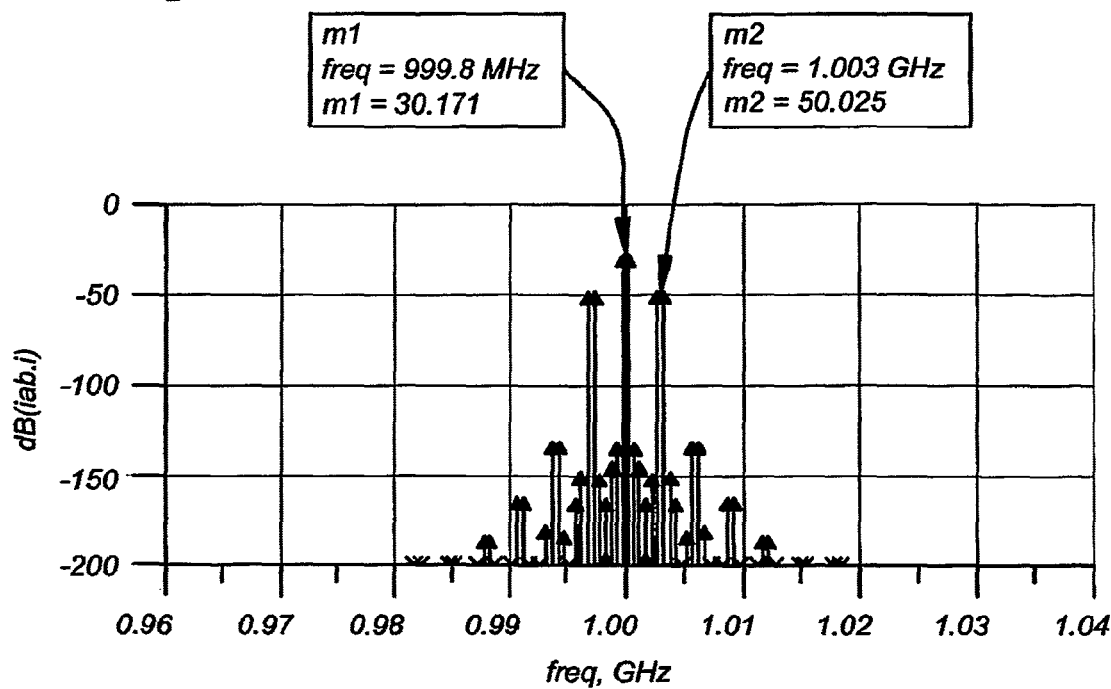
FIG. 6 shows the resulting spectrum under the same conditions as in FIG. 5 when using varactor elements according to an embodiment of the present invention.

In contrast to the DFVS, the NTSVS requires a base-band short in order to guarantee its low distortion operation. Consequently, for its correct operation low impedance paths at base-band frequencies (BB-shorts) have to be provided between the center tap (node c) and the a and b nodes, and high impedances for the fundamental and higher harmonics. The resulting spectrum of the capacitive current is given in FIG. 6. For a fair comparison the two-tone signal conditions, the effective capacitance value $c_{ab}$ and its relative change, are chosen the same as in the DFVS simulation experiment. The spectrum of the capacitive current is significantly improved compared to the results for the DFVS in this mixing experiment. It should be noted that the minimum inter modulation levels achieved in this experiment are now basically depending on, how well one can meet the short conditions at the base-band frequencies and the open conditions at the fundamental and higher harmonics.

In summary, the NTSVS topology provides, as compared to the previous state of the art, a high linearity for modulated signals and narrow tone spacings, a high tuning range compared to uniform doped varactors. Furthermore, only low control voltages required for large capacitance variation, and the arrangement is not sensitive for leakage current of the varactor diodes. Also, no high impedance conditions are required at IF impedance making it more suitable for the implementation of modulators, mixers and dynamic/adaptive matching networks.

Figure 7:
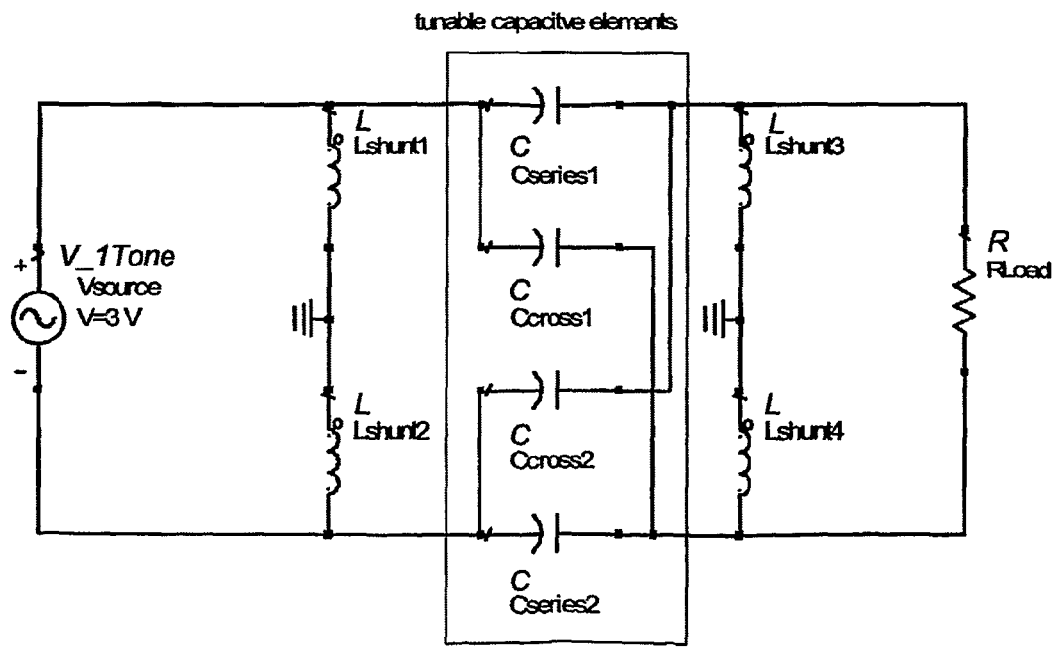
FIG. 7 shows a circuit diagram of a differential varactor amplitude modulator according to an embodiment of the present invention.

A further advantageous use of the varactor element according to the present invention can be found in the following exemplary embodiment. The differential varactor based Amplitude Modulator (DVAM) is based on the combination of direct and cross wise connected capacitive coupling of the in- and output, as shown in the schematic diagram of FIG. 7. One of the two series variable capacitors (Cseries1) is connected between a first input port and a first output port, the other of the two series variable capacitors (Cseries2) is connected between a second input port and a second output port. One of the two cross connected variable capacitors (Ccross1) is connected between the first input port and the second output port, and the other of the two cross connected variable capacitors (Ccross2) is connected between the second input port and the first output port. Furthermore, the input ports and output ports are connected to each other using shunt coils (Lshunt). At the input ports, a voltage source Vsource is connected (e.g. providing a 3V 2 GHz signal) and at the output ports, a load (Rload) is connected.

The principle of this configuration is based on the fact that the displacements currents through the directly connected capacitors (Cseries1, Cseries2) are in opposite phase with those of the cross coupled capacitor pair (Ccross1, Ccross2). When the circuit is driven differentially and all the capacitive elements have the same value, the capacitive currents will cancel. By varying the value of the cross wise connected capacitors (Ccross1, Ccross2) in respect to the direct connected capacitors (Cseries1, Cseries2), the displacement currents will not cancel and energy will be transferred from the differential input to output port or visa versa. By combining this capacitive quad with two shunt inductors (Lshunt) and proper dimensioning of its element values, some very special properties can be achieved for this circuit configuration, which makes it attractive as amplitude modulator in RF applications and in special applications, such as adaptive matching network in combination with a RF power amplifier stage. Note that such a combination facilitates in principle very high power added efficiency (PAE) for modulated signals or (slowly) varying output power conditions.

Although the above described embodiment uses varactor elements for all four capacitors, embodiments are also possible in which either the cross connected capacitors or the series connected capacitors are formed by fixed capacitors (not variable).

The unique behaviour of this circuit can be best studied by enforcing that the input impedance is ohmic. The input impedance of this configuration is given by:

$$z_{in} = \frac{(s^2 * Lc_{series} + s^2 Lc_{cross} + 2g_1 sL + 2)sL}{\left(\begin{array}{c} 2s^4 L^2 c_{series} c_{cross} + s^3 L^2 c_{series} g_1 + 2s^2 Lc_{series} + \\ s^3 L^2 c_{cross} g_1 + 2s^2 Lc_{cross} + 2g_1 sL + 2 \end{array}\right)}$$

Enforcing the imaginary part of $Z_{in}$ to be zero yields the following relation for the series and cross connected capacitors $$c_{cross} = \frac{-(\omega^2 Lc_{series} - 2)}{(\omega^2 L)}, \; c_{cross} = \frac{-(-\omega^2 Lc_{series} + 1 + g_{load}^2 \omega^2 L^2)}{(\omega^2 L(\omega^2 Lc_{series} - 1))}$$

in which:
$c_{series}$=series capacitor value
$c_{cross}$=cross connected capacitor value
$g_{load}$=single ended load conductance
L=shunt connected inductor By now changing the value of the $c_{series}$ versus $c_{cross}$ while satisfying the above condition for the values of $C_{series}$ and $C_{cross}$, the following properties are achieved.

The transfer ($s_{21}$) can be continuously varied between −j and +j;

The input impedance is always ohmic.

As a result, this circuit will not introduce any AM to PM (phase modulation) distortion, since the phase of $s_{21}$ is always on the imaginary axis. The phase reversal indicates the potential operation as multiplier. The fact that the circuit is lossless results in a reflection of all energy ($s_{11}=s_{22}=1$) when no power is transferred ($s_{21}=s_{12}=0$) from in- to output ($c_{series}=c_{cross}$), yielding an infinitely high impedance at the ports. (Note that an inverse behaviour ($s_{11}=s_{22}=-1$) is also possible if one uses series inductors rather then shunt inductors yielding short circuit conditions at the ports). The fact that the input impedance varies with the power transfer makes the network interesting for dynamic load line applications. Furthermore, the operation frequency of this network can easily customized by adjusting the values of the variable capacitances $c_{cross}$, and $c_{series}$.

Above, the small signal behaviour of the DVAM has been studied. Its principle is based on the use of tunable capacitances for the implementation of the series and cross connected capacitors. It is therefore logic to consider varactors for this purpose. In the following simulation experiment we will compare the large signal performance of the DFVS and the NTSVS for this amplitude modulator. It will be shown, that the proposed varactor structure of the present invention, using base band shorts will provide superior performance over the DFVS in this application.

When using ideal variable capacitors, applying a 2 GHz sinusoidal voltage with 3 V signal amplitude at the input of the DVAM, and modulating the values of $c_{series}$ and $c_{cross}$ using a low frequency (base band) sinusoidal signal of 1 MHz, would result in a perfectly multiplied signal, i.e. a two tone signal with an ideal spectrum (1.999 GHz and 2.001 GHz) without any inter modulation effects (especially third order IM).

Figure 8:
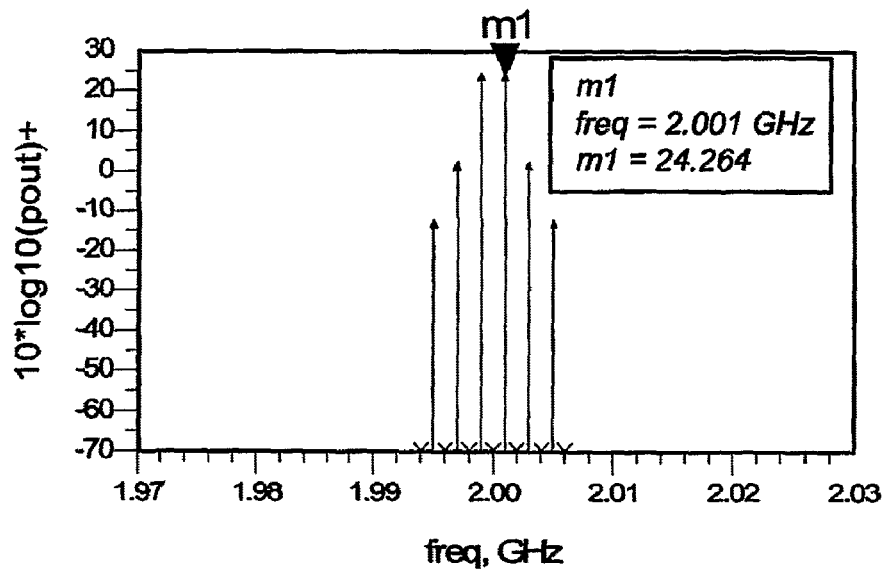
FIG. 8 shows the resulting spectrum of a 2 GHz sinusoidal source signal modulated by a 1 MHz base band signal, using conventional varactor diodes as variable capacitor in the circuit diagram of FIG. 7.

When using the earlier described distortion free varactor stacks (DFVS) as variable capacitors, the spectrum shown in FIG. 8 is obtained. In terms of third order inter modulation (IM3) this spectrum is very bad.

Figure 9:
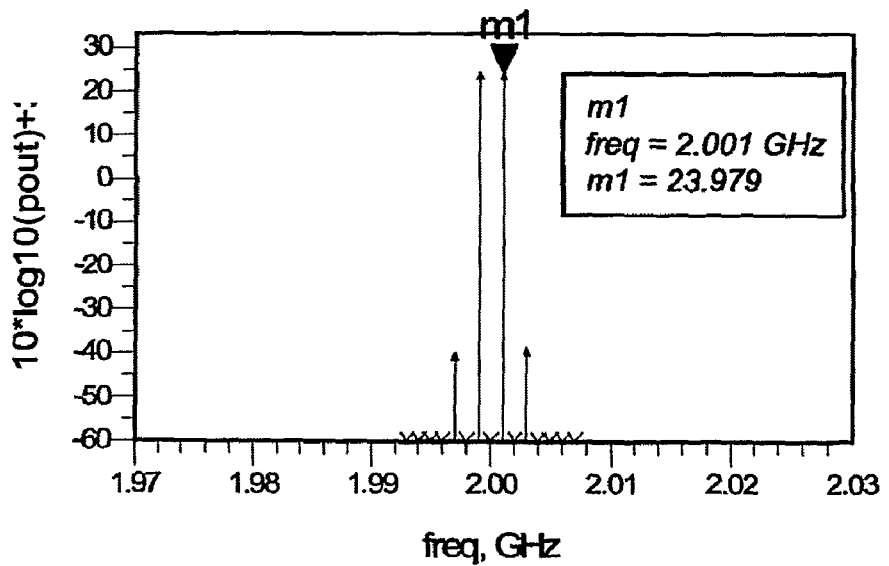
FIG. 9 shows a similar spectrum when using an embodiment of the varactor element according to the present invention.

When using NTSVS devices according to one of the embodiments of the present invention (with an $N/x^2$ doping profile), again, a low impedance path for the base-band frequencies between the center tap node and RF terminals of the NTSVS devices is provided. If a high valued inductor is used to connect the modulating voltage to the center tap of each NTSVS, these conditions are automatically fulfilled. This is a big advantage in controlling the capacitance to its desired value. The spectrum of the two-tone signal generated using this circuit topology for the same signal conditions as before is given in FIG. 9. As can be noted from this experiment now a very clean two-tone signal is obtained of more than 70 dBc using a 3V amplitude swing at is input. This is an important result since it indicates that using a varactor device with a special but realistic doping profile a close to ideal non dissipative amplitude modulator can be implemented.

Figure 10:
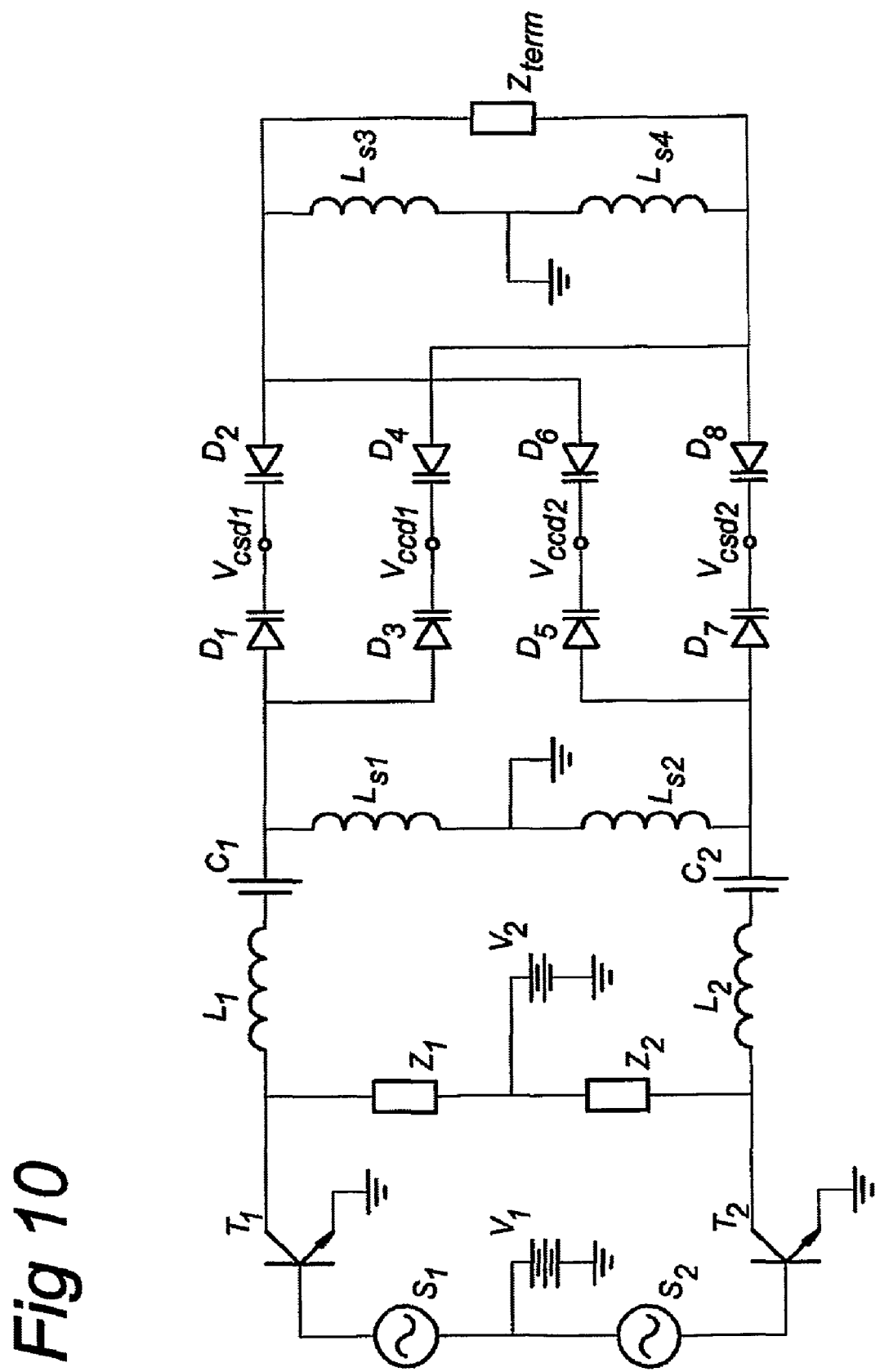
FIG. 10 shows a circuit diagram of an amplifier circuit using an embodiment of the four port electronic device according to an embodiment of the present invention.

In a further embodiment of the present invention, NTSVS varactor elements are used in a polar amplifier circuit, of which the schematic diagram is shown in FIG. 10. Currently, people are considering polar amplifiers concepts to improve on spectral noise, efficiency and flexibility in terms of serving multiple communication standards. One of the common characteristics of these amplifiers is the saturated operation of the active device(s) in order to boost the amplifier efficiency. This saturated operation results in square wave like signal conditions at the output of the amplifier. However, due to the saturated operation of the amplifier, the output power is no longer linearly related to the input power. To solve for this problem currently in polar amplifier implementations, dynamic supply voltage modulation is considered to control the amount of output power. Although, having some advantages there are the following complications with this approach:

A highly efficient DC to DC converter is required;
Switching noise of the DC-to-DC converter requires extensive filtering resulting in the use of unrealistically large circuit implementations;
Voltage modulation results in AM-PM modulation by the active devices, consequently pre-distortion is required.

Figure 11A:
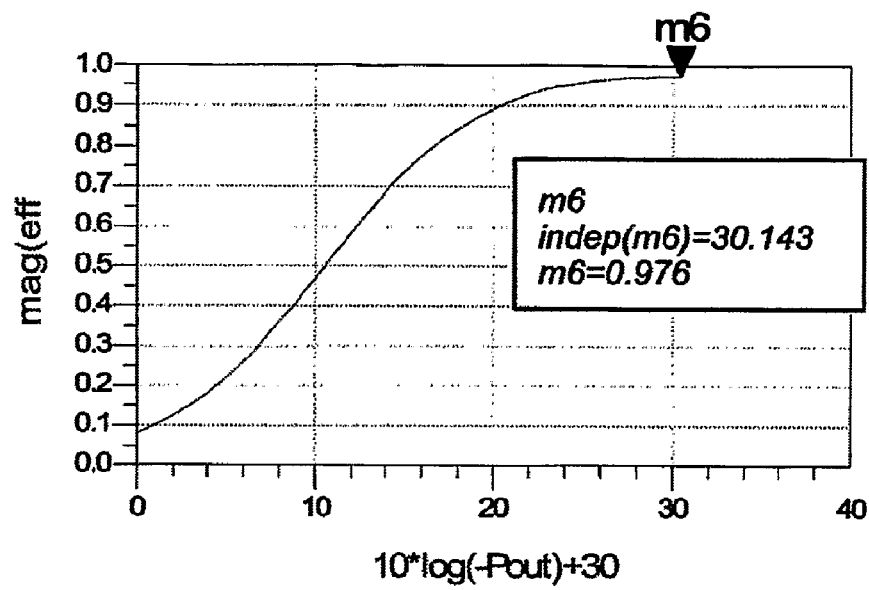
FIG. 11a shows the efficiency plotted versus output power for single tone operation of the amplifier circuit of FIG. 10 using loss-less components.
Figure 11B:
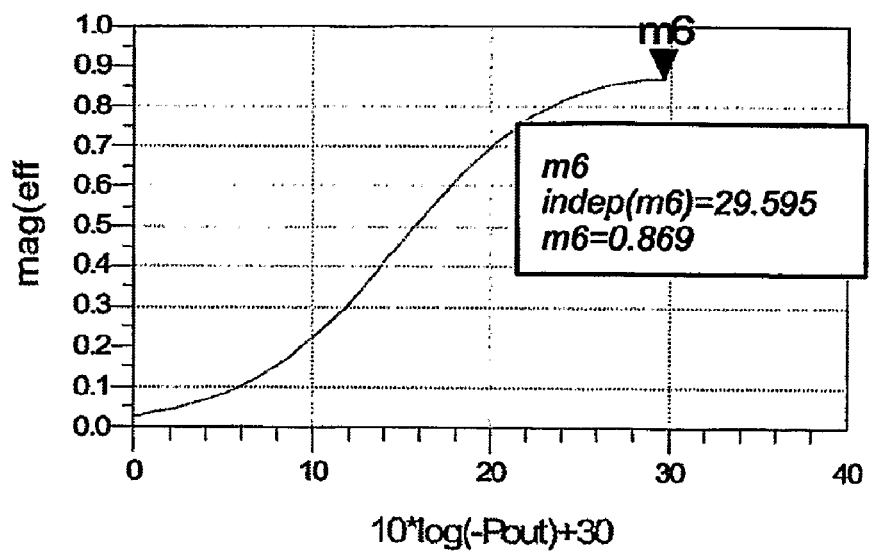
FIG. 11b shows the efficiency versus output power when assuming a Q factor of 100 for the passive components.
Figure 11C:
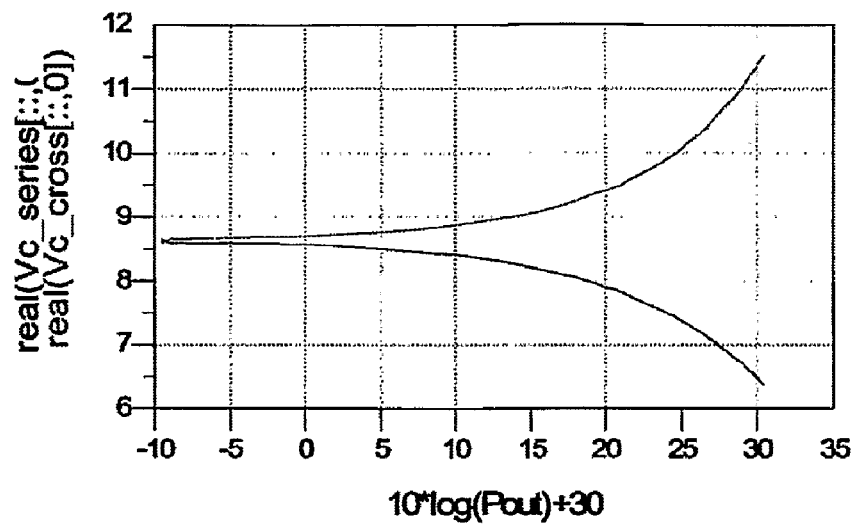
FIG. 11c shows the required DC control voltages for the varactor elements.

An alternative for the dynamic voltage modulated polar amplifier concept is to make use of dynamic loading of the output stage in order to control the amount of output power. Using the DVAM topology as described in the embodiments above, it is quite easy to implement this. Although this can be done in various ways, an exemplary embodiment is shown in FIG. 10. In this FIG. 10 the DVAM (comprising varactor elements D1 ... D8, shunt inductors Ls1 ... Ls4, in which the control points of each NTSVS stack are indicated by Vcsd1, Vccd1, Vccd2, and Vcsd2, respectively) performs the dynamic matching and modulation function. The DVAM is controlled by base-band signals which ensure the desired capacitance modulation of the NTSVS devices. All components levels and control signals can be chosen in respect to the desired output power, supply voltage and capacitance tuning range. Additional stubs Z1 and Z2 at the output of transistors T1 and T2 are for the biasing and to provide short conditions for the even harmonics. Additional series resonators are provided using inductances L1, L2 and capacitors C1, C2, respectively. The additional series resonators (center frequency fo) are added to provide a high impedance for the odd harmonics, both are required in order to obtain the highest power added efficiency (PAE). The PAE versus output power when ideal transistors (Default Gummel Poon model) with lossless inductors and varactors are assumed are given in FIG. 11. The power sweep is obtained by changing the static voltages of the varactor in DVAM structure. The graph of FIG. 11a shows the efficiency plotted versus output power for single tone operation of the amplifier using loss-less components. The graph of FIG. 11b provides the results when assuming a Q of 100 for the passive components. In the graph of FIG. 11c the required DC control voltages for the NTSVS elements are plotted against the power (upper trace for the cross connected varactor elements and the lower trace for the series connected varactor elements). It can be observed that a very high efficiency can be obtained over a large power control range. Also the required control voltages are limited in value Further optimization of the circuit in terms of component values and or impedance levels can reduce the required control voltages even more.

Figure 12:
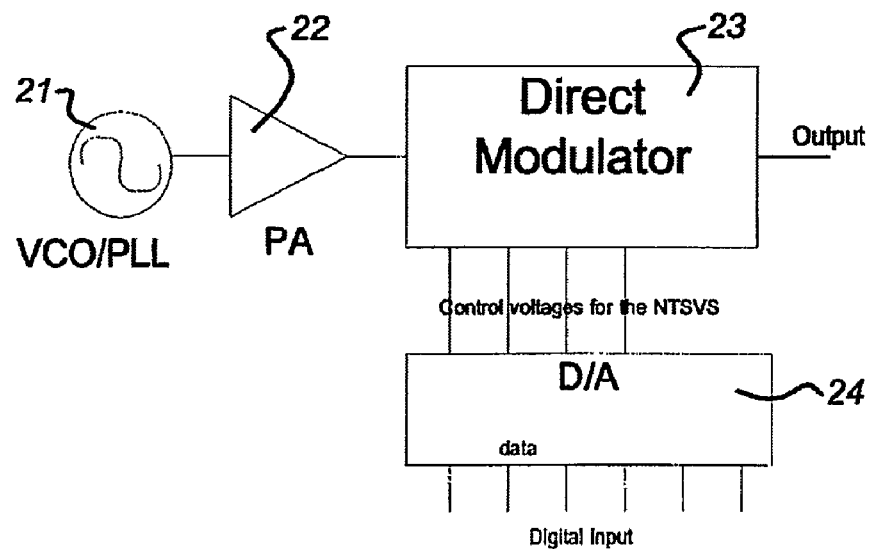
FIG. 12 shows a schematic diagram of an embodiment of a transmitter architecture using a direct modulator based on varactor elements according to embodiments of the present invention.
Figure 13:
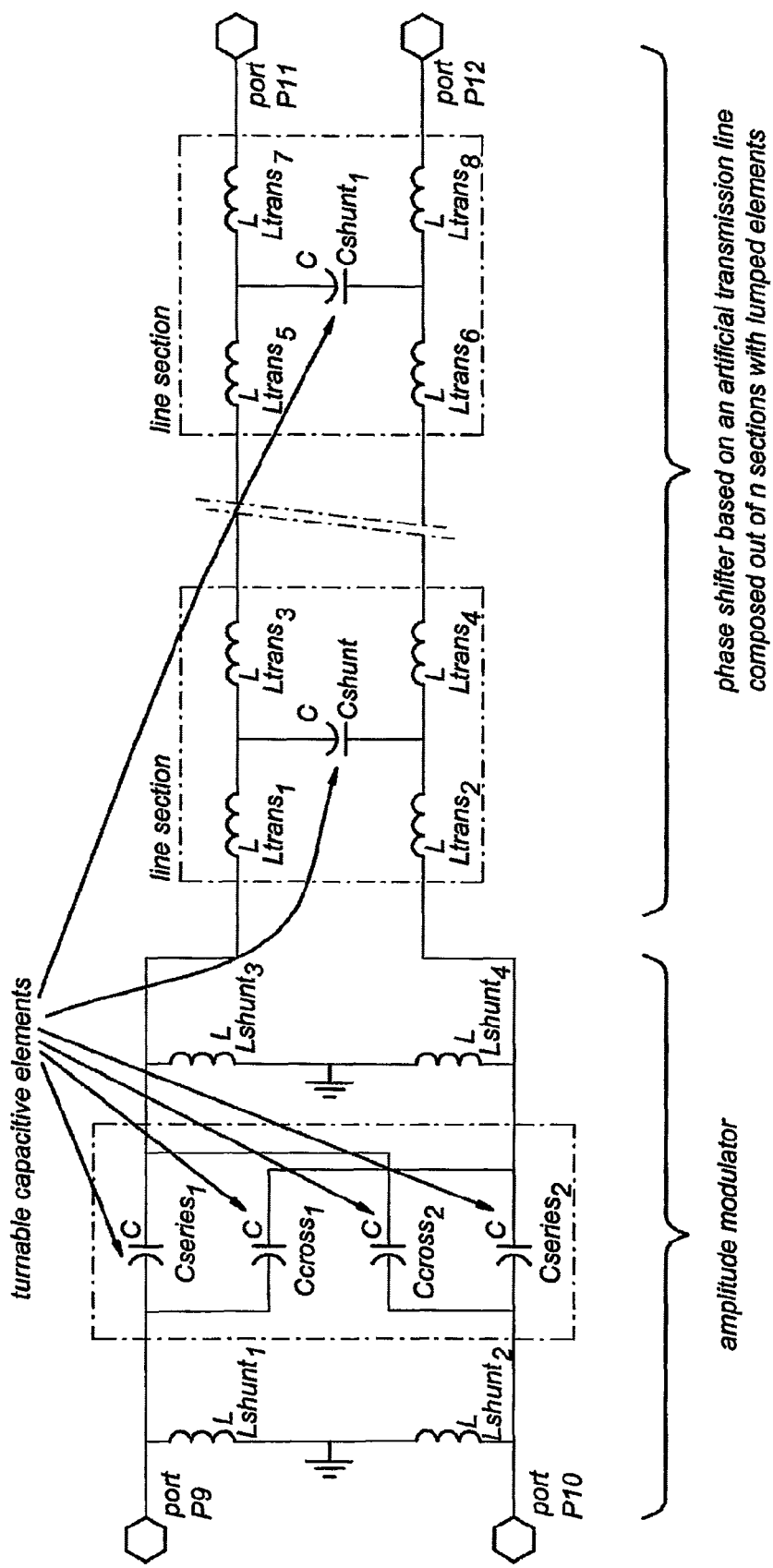
FIG. 13 shows a circuit diagram of an embodiment of a direct polar modulator as used in the transmitter of FIG. 12.

In a further embodiment of the present invention, a direct modulator is proposed which combines a DVAM with a variable phase shifter, as shown in the schematic diagram of FIGS. 12 and 13. In this embodiment, the amplitude and phase shift can be set by the control voltages of the NTSVS elements, yielding a polar modulator. Note that such a configuration, can considerably simplify the traditional architecture of a transmitter while still capable of generating the desired complex modulated signals, which are typically in use in wireless communication.

The newly proposed transmitter architecture, using a direct modulator based on NTSVS elements, is given in FIG. 12. A voltage controlled oscillator (VCO, e.g. based on a phased locked loop PLL) 21 provides a carrier wave to a power amplifier (PA) 22. The output of the PA 22 is provided to a direct modulator 23, of which an implementation is shown in FIG. 13 described below. The direct modulator 23 receives control voltages for the NTSVS elements from a digital to analogue converter 24 (D/A), which in its turn is supplied with digital input data for modulating the carrier wave. The output of the direct modulator 23 then provides the modulated signal.

As can be noted from this figure, the NTSVS elements in the modulator are controlled for their capacitance value by the voltages delivered by the digital to analogue converter 24, which operates at, or at a multiple of the base-band frequency. This concept eliminates the need for many RF function blocks in conventional transmitter designs. By controlling the transfer of the polar modulator in a time variant way, the constellation diagram of the desired modulation can be obtained. By also accurately controlling the transitions between the constellation points in the proper fashion, the resulting frequency spectrum at the output of the polar modulator can be adjusted to meet the communication standard requirements under consideration. Note that this basically eliminates the need of intermediate filters in conventional amplifier implementations. Consequently, the resulting transmitter structure is directly capable to serve many different modulation formats, depending on the desired communication standard (e.g. QPSK, BSK, FSK, OFDM etc) by just changing the input of the digital input of the D/A converter 24. Note that now complex modulation schemes can be generated without the need of linear RF circuit blocks for the mixers and power amplifier. This will result in a power reduction of the total transmitter.

Since the NTSVS elements are tunable, also multiple frequency bands can be easily addressed by offsetting the NTSVS values in the network in a proper way (e.g. as discussed above in relation to the DVAM embodiments). The phase shifter, when based on all pass networks or on an artificial transmission line concept, composed out off many LC sections in which the capacitive elements are implemented by NTSVS elements, is wide band in nature itself, yielding a frequency reconfigurable network. Note that such a network can have considerable advantages when aiming for multi-communication standards or multi-frequency band transceivers since no intermediate filters or other (reconfigurable) RF functions are required. The proposed setup can also be useful for low power very high frequency transmitter implementations, since less power for the otherwise power hungry RF circuit blocks are required.

A potential implementation example of such a direct modulator is shown schematically in FIG. 13. In this schematic the DVAM (see embodiment of FIG. 7) is followed by an artificial transmission line composed out off n LC sections, each comprising four transmission inductances (Ltrans1 .... Ltrans4) and a capacitance element Cshunt. The capacitive elements Cshunt are implemented by NTSVS elements. By changing the control voltages of the NTSVS elements, any phase shift or amplitude can be achieved. In this configuration benefit is obtained once again from the properties of the DVAM network that the input impedance tracks with the desired output power, facilitating again the implementation of a highly efficient amplifier but now using a direct modulator with base-band control. It must be mentioned that many network topologies are possible for the amplitude and the phase modulator that result in similar properties as shown here. Also single-ended versions are possible. Essential in all these solutions is a tunable capacitive element that allows fast tuning and that does not cause any inter modulation distortion, the NTSVS device according to embodiments of the present invention being such a component.

Using a DVAM implementation with NTSVS devices according to the present invention, a number of advantages may be achieved:
  Provides low Q impedance transformation (matching) between in and output;
  Signal transfer ($s_{21}$) can be controlled between −1 through 0 to 1;
  Structure can be easily customized for the available tuning range of the varactor;
  Low control voltages required;
  The 180 phase reversal in $S_{12}$ makes it a perfect up-converting mixer;
  No phase variation during tuning (no AM-PM distortion);
  Yields ohmic loading conditions at in- and output over whole tuning range;
  Tuning range can be selected between a fixed impedance and infinity;
  Tuning range can be selected between a fixed impedance and short circuit conditions at fundamental;
  Operating frequency can be easily tuned by changing the bias conditions of the varactors;
  Perfectly linear in combination with NTSVS diode for both sinusoidal as well square wave input signals.

Although the examples given in this document are mostly differential in nature, also single ended versions are very well possible to realize the desired circuit functions (namely, static or dynamic loading/output power control as well phase shifting trough the used of NTSVS based elements). This can serve many actual applications in telecommunication and radar systems.

Figure 14:
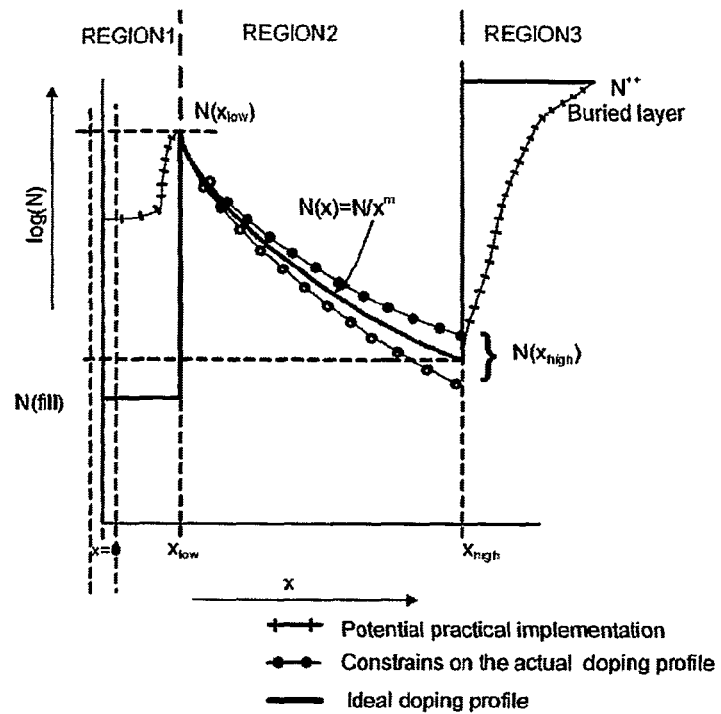
FIG. 14 shows a doping profile diagram of a further embodiment of the varactor element according to the present invention having a single sided junction.

In FIG. 14, a more detailed view is shown of a Q optimized varactor doping profile for varactor tuned or modulated linear narrowband applications. In these embodiments, the following profile constraints are applied:
  The useful capacitance tuning ratio which is defined by ratio $X_{high}/X_{low}$, ranges for practical and useful implementations from 2 to 15, or even higher ratios.
  Region 1) Spacer layer.
    Spacer layer thickness
      The spacer layer is required to ensure the proper doping relation versus distance in region 2. The thickness of the spacer layer is in principle equal to $X_{low}$:
      $X_{low}$ can range from 0.03 μm for low voltage applications ($V_{breakdown}$<5V) to 0.3 μm for high voltage applications ($V_{breakdown}$>40V) (see also table 1). Significantly lower or higher voltage ranges might widen the above constraints
      In practical implementation the exact location of the junction is important in order to avoid linearity degradation when the varactor is applied in the appropriate circuit configuration. The exact location of the junction needs to be at x=0 within a tolerance of +/−0.2*$X_{low}$.
    Spacer layer doping/sheet resistance
      The exact doping of the spacer layer has not too much effect on the intended linearity rather than a shift in control voltage. However the doping of the spacer layer will give rise to an undesired increase in the electric field causing restrictions on the achievable compromise in device breakdown-tuning range-quality factor. For this reason the doping concentration in the spacer layer needs to be restricted. If we assume set that the increase in electrical field due to the doping of the spacer layer should not exceed half the value of the critical electrical field e.g. in silicon $$\Delta E = \frac{1}{2} E_{crit} = 3 \times 10^5 \text{ V/cm},$$

the related sheet resistance of this layer should be higher then 2385Ω/□. For materials with other values for the critical field strength similar considerations can be made.
  Region 2) Graded doping profile.
    This region is responsible for the intended approximated exponential C(V) relation, which in combination with the appropriate circuit configuration yields the highly linear operation. For highly linear operation the grading coefficient m should be between 1.7 and 2.3. The highest linearity in for practical implementations is achieved with m=2.1 rather then 2. This is caused by a cancelling effect that occurs between third and fifth order distortion components. It is very important that the C(V) function does not exhibit any humps and is purely monotonic.
    The doping concentration $N(X_{low})$ follows from the equations 3.7 to 3.11 as given in the detailed description below, and offers the best quality factor for a given breakdown and capacitance tuning range. The value of the effective (activated) doping is typically between 4e18 for devices with a breakdown voltage of <5V and 1e17 for devices with a breakdown voltage of >40V (see table I)

Region 3) Buried Layer

The buried layer should directly connect to the graded doping profile without introducing significant series resistance. Varactor implementations from the prior art suffer from the low doped connection (series resistance) between the graded profile and the buried layer, lowering the quality factor of the varactor. The capacitance voltage relation in these implementations when the depletion region extends to this region is not relevant for our application since the intended approximated exponential C(V) relation is violated, yielding a higher distortion. The series resistance offered by the buried layer should be significantly lower than the intrinsic sheet resistance offered by the region 2. Consequently, for high Q varactor implementation we require that the sheet resistance of the buried layer is lower than the intrinsic sheet resistance of region 2 (e.g. see table I in the detailed description below).

Figure 15:
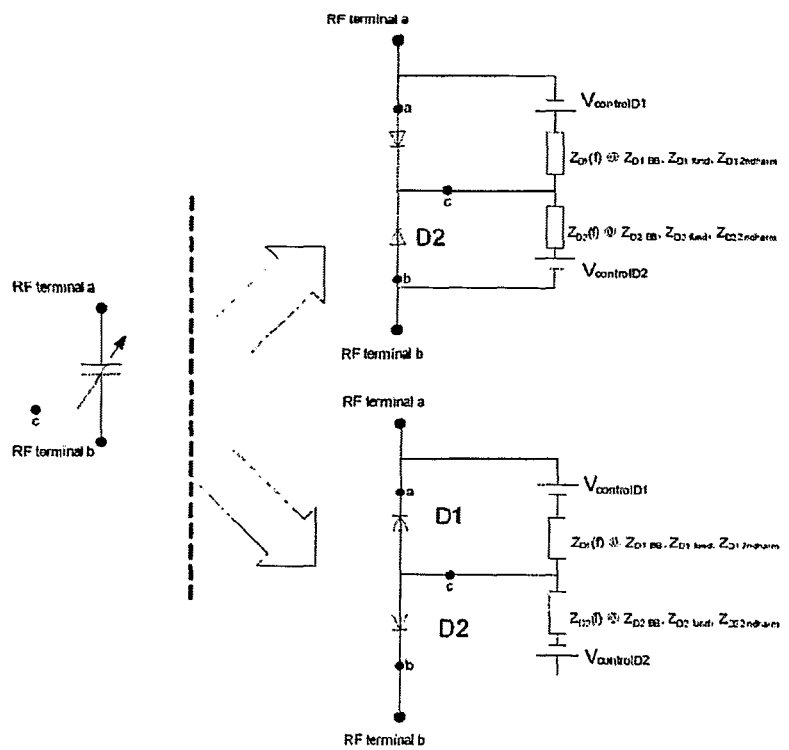
FIG. 15 shows a low distortion configuration for varactor tuned/modulated narrowband (transmitter) applications of varactors according to an embodiment of the present invention.

In FIG. 15, an exemplary embodiment is shown of a low distortion configuration for varactor tuned/modulated narrowband (transmitter) applications of varactors according to the present invention (with a doping profile as given in FIG. 15) utilizing baseband "shorts" and harmonic "open" conditions for the fundamental and $2^{nd}$ harmonic between the nodes a and c, and between nodes b and c.

In order to create a low distortion varactor for narrowband modulated signals, the varactor configuration of FIG. 15 should be utilized. The intended tuneable component is connected with its RF terminals a and b to the appropriate place in a tuneable network e.g. adaptive matching network or filter. In difference to the know low distortion varactor configurations, this varactor configuration utilizes baseband "shorts" and "open" conditions for the fundamental and $2^{nd}$ harmonics between node a and c and node b and c and only works well when using varactors with a doping profile as given in FIG. 14.

In view of FIG. 15 the conditions on the terminal impedance for low distortion operation of narrowband modulated signals (<200 MHz band width) are:

$$|Z_{Baseband}| \times 10 < |Z_{diode}| @ f_{baseband}$$

$$|Z_{fundamental}| > 10 \times |Z_{diode}| @ f_{fundamental}$$

$$|Z_{second}| > 10 \times |Z_{diode}| @ f_{2nd\ harmonic}$$

in which $Z_{diode}$ is the impedance offered by the varactor diode in reverse bias at the indicated frequency.

These conditions apply for both diodes and should be satisfied simultaneously the individual impedance values offered to D1 and D2 may differ, however they should satisfy the upper requirements. The control voltage $V_{controlD1}$ and $V_{controlD2}$ can also differ in value but should keep the diodes in reverse bias.

Figure 16:
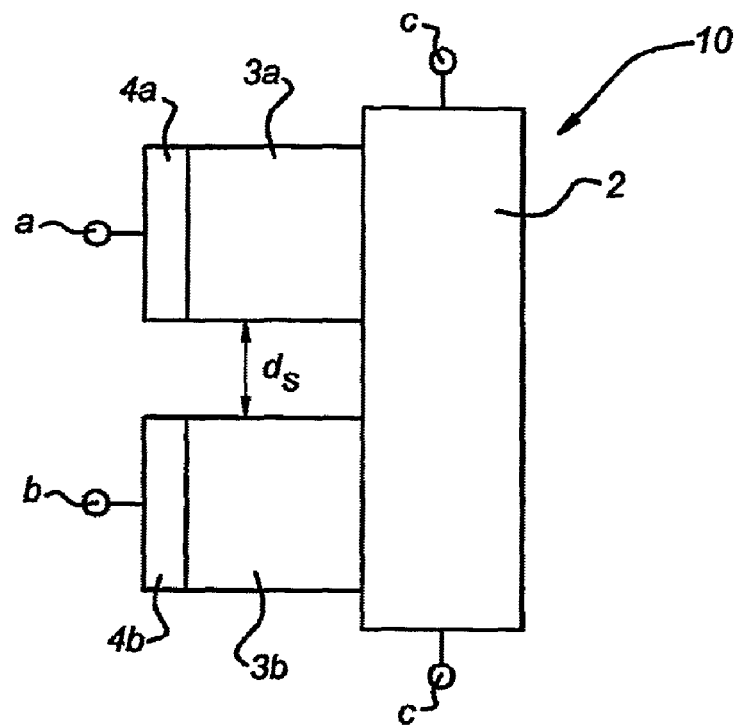
FIG. 16 shows a possible configuration of a varactor stack device according to an embodiment of the present invention comprising two Schottky diodes.

In FIG. 16, a simple implementation of a varactor stack is given. Two Schottky diodes (or varactor elements) are formed on top of a buried layer 2, in which each Schottky diode comprises a metal layer 4a, 4b on top of a doped semiconductor layer 3a, 3b. The doping profile of each doped layer 3a, 3b is according to the embodiments described above (see e.g. FIG. 1, 2a or 14), in which x=0 at the Schottky interface (between metal layer 4a, 4b and doped layer 3a, 3b). A buried layer 2, connecting the two Schottky diodes by a low impedance material, is provided having a low sheet resistance to achieve a high quality factor for large varactor capacitance values. The distance between the two Schottky diodes (indicated by ds in FIG. 16) should be kept to a minimum, to be able to keep the impedance between the two Schottky diodes as low as possible. It is noted that for correct operation, the correct harmonic terminations should be provided at terminals a, b and c indicated in FIG. 16, as described above.

Figure 17:
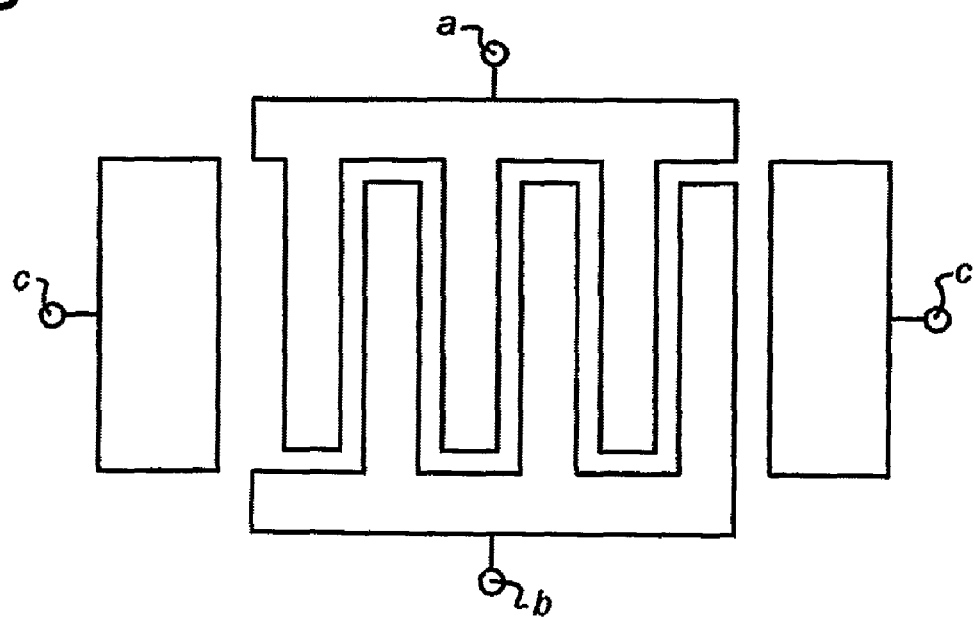
FIG. 17 shows a top view of terminals of a varactor stack circuit according to an embodiment of the present invention.

In an integrated process technology to optimize the Quality factor (Q) of a varactor diode with a large capacitance value, typically a finger structure is applied to reduce the influence of the sheet resistance of the buried layer 2. In FIG. 17 a top view of the terminal structure of such an embodiment is shown. It will be apparent to the skilled person that the areas indicated by a, b, and c (corresponding to the terminals a, b, and c of the embodiment shown in FIG. 3a, b and c) correspond to the Schottky diode and control node layers as shown in e.g. FIG. 16. This approach is favoured since the sheet resistance of the buried layer 2 in a integrated process technology can not easily reduced to any extent without rising problems of isolating devices from each other. When implementing a varactor stack for RF applications using the finger approach this method works reasonable well for capacitors with a not too high capacitance value (e.g. below 5 pF). Since the conditions for the center tap impedance (terminal c) are less strict than for the RF path the connection scheme for this terminal is more relaxed and can be limited to one or two contacts of the total structure.

When considering discrete implementations of the varactor stack with a highly doped substrate the effective resistance of the buried layer 2 and doped substrate between the diodes can be reduced to such an extend that the finger structure can be omitted. The resulting device is no longer isolated, but this is no longer a concern since after cutting the wafer the component can be flip chipped on a hybrid circuit implantation. Note that the harmonic termination of the center tap connection (terminal c, e.g. an inductor) can be placed on the discrete varactor stack component or the hybrid board.

Figure 18A:
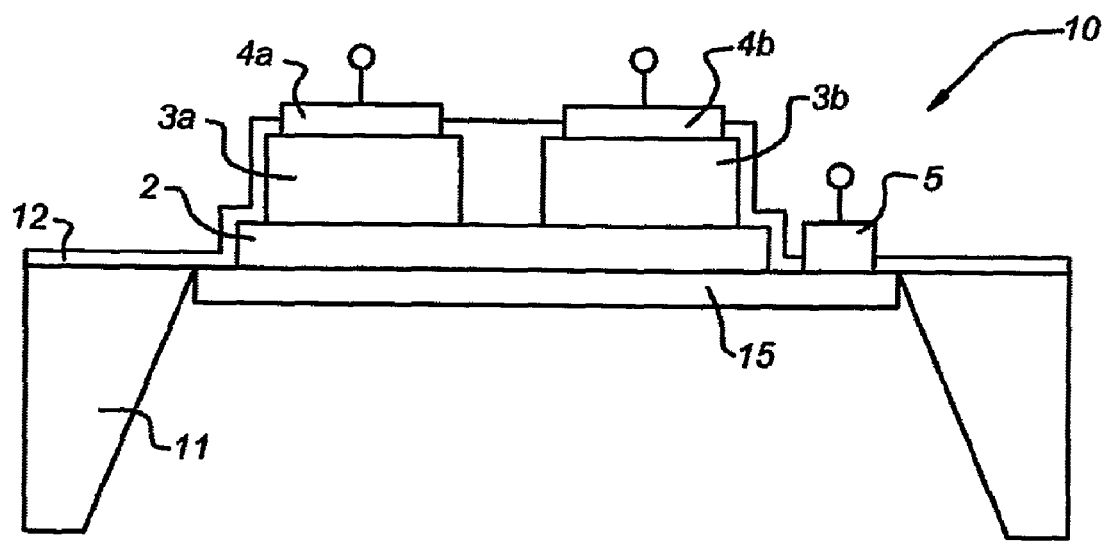
FIG. 18a shows a sectional view of a semiconductor structure of a varactor stack assembly according to a further embodiment of the present invention.
Figure 18B:
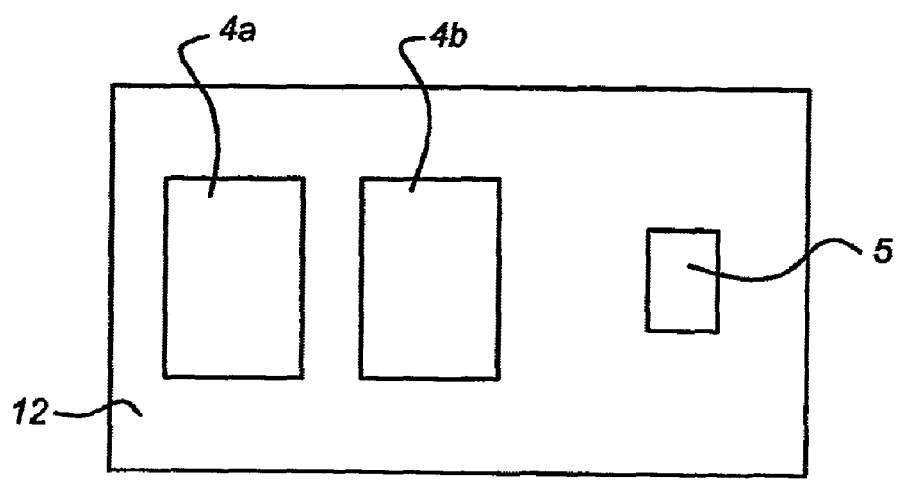

A drastically way to reduce the effective sheet resistance of the buried layer in an integrated process technology which requires isolation between individual components is the use of a backside metal contact in combination with micromachining. The intended structure is shown in FIG. 18a. The varactor stack device is indicated by reference numeral 10, and is formed on a silicon or III-V material wafer 11. As in earlier embodiments, the varactor stack device 10 is formed by providing a buried layer 2 having a low sheet resistance, on which two Schottky diodes are formed by doped layers 3a, 3b and metal layers 4a, 4b, respectively. Between the Schottky diodes and surrounding the metal layers 4a, 4b, a layer of oxide 12 is provided. Note that in this figure the backside of the wafer 11 is etched away until the buried layer 2 is reached. This etching can be controlled using an etch stop layer e.g. buried oxide in the case of using a silicon on isolator wafer or by similar techniques in III-V materials. By making contact holes in the etch stopping layer and directly contacting the buried layer 2 or the lightly doped N region with a thick metal (back metal layer 15), the effective resistances between the diodes in the RF path can be seriously reduced (the two varactor elements being connected by a low impedance (combination of) material(s). Consequently, the sheet resistance of the buried layer 2 is less an issue since the back metal layer 15 takes care for the conduction of the RF signal. The control terminal 5 (control node c of the equivalent diagram of FIG. 3a-c) can be connected to the frontside of the wafer through a via. As a result no finger structures are anymore required on the front side resulting in an effective reduction of the required wafer area and an improved Q factor. Note that in this approach there are no high quality vias to the front side of the wafer required The only connection to the front side of the wafer is for the implementation of the center tap terminal 5 but since this terminal should only provide a connection for the DC and baseband signals the impedance requirements are quite relaxed for this connection. In FIG. 18b a top view of the varactor device 10 of FIG. 18a is shown, indicating the positions of the metal contacts 4a, 4b, 5. Note that finger structures (such as in the embodiment of FIG. 17) at the top side are no longer needed due to the reduced resistance of the backside metal connection 15. The structure can be further improved and customized by taking measures to improve the mechanical stability, e.g. by gluing or growing mechanical support layers.

The present invention, its implementations and theoretical background may be understood in more detail from the following.

The invention claimed is:

1. A varactor stack circuit arrangement, comprising:
   two varactor elements each having two terminals and comprising:
   a junction region, in which the depletion capacitance of the varactor element varies when a reverse bias voltage is applied to the varactor element, wherein the varactor element has an exponential depletion capacitance-voltage relation, in which the junction region comprises a single sided junction; the varactor element is provided with a doping profile substantially defined by:

$$N(x) = N \Big/ \Big(\frac{x}{x_{low}}\Big)^m$$

wherein $N(x)$ is the varactor element's doping concentration in one dimension as a function of x (for $x > x_{low}$), where x is a distance from the single sided junction, N is a predefined doping concentration constant, and m is an exponential factor;
   the junction region comprises a filling layer in an interval of distances lower than $x_{low}$ with a doping concentration of $N_{fill}$ lower than the doping concentration at distance $x_{low}$ ($N(x_{low})$); and
   the two varactor elements are connected in an anti-series configuration, such that a control node is provided by two interconnected terminals and two RF connection nodes by the other terminals.

2. The varactor stack circuit arrangement according to claim 1, wherein the exponential factor has a value in the range $1.7 < m < 2.3$.

3. The varactor stack circuit arrangement according to claim 1, wherein the doping profile is substantially equal to $N(x)$ at least in the interval $x_{low} \ldots x_{high}$, in which $x_{low}$ is nearer to the single sided junction than $x_{high}$.

4. The varactor stack circuit arrangement according to claim 1, wherein the junction region is a two sided or double sided junction.

5. The varactor stack circuit arrangement according to claim 1, wherein the two varactor elements are connected by a low impedance material.

6. The varactor stack circuit arrangement according to claim 5, wherein the low impedance material comprises a back side metallization.

7. The varactor stack circuit arrangement according to claim 5, wherein the varactor stack circuit arrangement further comprises a center tap impedance connected to the control node, the center tap impedance providing a low impedance path for base band frequency components between the control node and each of the two RF connection nodes.

8. The varactor stack circuit arrangement according to claim 7, wherein the low impedance path has an impedance lower than the varactor element capacitances for the base-band frequency components.

9. The varactor stack circuit arrangement according to claim 7, wherein which the base band frequency is the separation frequency of a signal having a narrow tone spacing or the modulation frequency of a modulated (RF) signal.

10. An adaptive or dynamic matching network comprising the varactor stack circuit arrangement according to claim 1.

11. An adaptive or tunable phase shifter device comprising the varactor stack circuit arrangement according to claim 1.

12. A direct modulator arrangement comprising the varactor stack circuit arrangement according to claim 1.

13. An up converting mixer or modulator comprising the varactor stack circuit arrangement according to claim 1.

14. An RF switch comprising the varactor stack circuit arrangement according to claim 1.

15. A tunable filter or multiplexer comprising the varactor stack circuit arrangement according to claim 1.

16. An antenna array system comprising the varactor stack circuit arrangement according to claim 1.

17. A four port electronic arrangement, comprising two series capacitors and two cross connected capacitors,
   wherein one of the two series capacitors is connected between a first input port and a first output port,
   the other of the two series capacitors is connected between a second input port and a second output port,
   one of the two cross connected capacitors is connected between the first input port and the second output port, and
   the other of the two cross connected capacitors is connected between the second input port and the first output port,
   further wherein at least the two series capacitors or the two cross connected capacitors comprise the varactor stack circuit arrangement according to claim 1.

18. The four port electronic arrangement according to claim 17, further comprising a first shunt inductor connected between the first and second input port, and a second shunt inductor connected between the first and second output port.

19. A direct polar modulator, comprising the four port electronic arrangement according to claim 17, wherein the first and second output ports are further connected to a series of phase shift sections, each phase shift section comprising the varactor stack circuit arrangement.

* * * * *